United States Patent
Lee et al.

(10) Patent No.: US 9,570,189 B1
(45) Date of Patent: Feb. 14, 2017

(54) DATA STORAGE DEVICE AND OPERATING METHOD THEREOF

(71) Applicant: SK hynix Inc., Gyeonggi-do (KR)

(72) Inventors: Jae Yoon Lee, Gyeonggi-do (KR); Hyung Min Lee, Gyeonggi-do (KR); Myeong Woon Jeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/097,793

(22) Filed: Apr. 13, 2016

(30) Foreign Application Priority Data

Dec. 2, 2015 (KR) ........................ 10-2015-0170805

(51) Int. Cl.
| | | |
|---|---|---|
| *G11C 11/34* | (2006.01) | |
| *G11C 16/34* | (2006.01) | |
| *G11C 16/26* | (2006.01) | |
| *G06F 11/10* | (2006.01) | |
| *G11C 29/52* | (2006.01) | |
| *G11C 16/28* | (2006.01) | |

(52) U.S. Cl.
CPC ....... *G11C 16/3404* (2013.01); *G06F 11/1068* (2013.01); *G11C 16/26* (2013.01); *G11C 16/28* (2013.01); *G11C 29/52* (2013.01)

(58) Field of Classification Search
CPC ... G11C 16/10; G11C 11/5628; G11C 11/5642
USPC ....................................... 365/185.24, 189.16
See application file for complete search history.

(56) References Cited

U.S. PATENT DOCUMENTS

2008/0055999 A1* 3/2008 Nakajima ........... G11C 11/5628
365/185.18

FOREIGN PATENT DOCUMENTS

KR      1020140107000      9/2014
KR      1020150040615      4/2015

* cited by examiner

*Primary Examiner* — Son Dinh
(74) *Attorney, Agent, or Firm* — IP & T Group LLP (57) ABSTRACT

A data storage device includes a nonvolatile memory device including a target memory cell and one or more adjustment memory cells sharing bit lines with the target memory cell, one or more of the adjustment memory cell are adjacent memory cells adjacent to the target memory cells, and suitable for reading out data therefrom or storing data therein; and a controller suitable for adjusting threshold voltages of the adjustment memory cells based on threshold voltages it of the target memory cell and the adjacent memory cells.

21 Claims, 10 Drawing Sheets

DATA STORAGE DEVICE AND OPERATING METHOD THEREOF

CROSS-REFERENCES TO RELATED APPLICATION

The present application claims priority under 35 U.S.C. §119(a) to Korean application number 10-2015-0170805, filed on Dec. 2, 2015 in the Korean Intellectual Property Office, which is incorporated herein by reference in its entirety.

BACKGROUND

1. Technical Field

Various embodiments generally relate to a data storage device, and, more particularly, to a data storage device performing an improved error correction operation.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices can be embedded in external devices or fabricated separately and then connected afterwards.

As the integration density of data storage devices continues to increase in order to satisfy consumer demand for higher storage capacity portable electronic devices the probability of erroneously read data increases. Hence, although error correction decoding circuits and schemes are well known in the art, recently there has been an increased need for data storage devices with improved error correction performance.

SUMMARY

In an embodiment, a data storage device may include: a nonvolatile memory device including a target memory cell and one or more adjustment memory cells sharing bit lines with the target memory cell, one or more of the adjustment memory cell are adjacent memory cells adjacent to the target memory cells, and suitable for reading out data therefrom or storing data therein; and a controller suitable for adjusting threshold voltages of the adjustment memory cells based on threshold voltages of the target memory cell and the adjacent memory cells.

In an embodiment, a data storage device may include: a nonvolatile memory device including a first memory cell and one or more third memory cells sharing bit lines with the first memory cell, one or more of the third memory cell being second memory cells adjacent to the first memory cell, and suitable for reading out data therefrom or storing data therein; and a controller suitable for storing third data into the third memory cells based on first data read from the first memory cell and the second data read from the second memory cells.

In an embodiment a method for operating a data storage device including a first memory cell and one or more third memory cells sharing bit lines with the first memory cell, one or more of the third memory cell being second memory cells adjacent to the first memory cell may include: acquiring first data read from the first memory cell; acquiring second data read from the second memory cells; and storing a third data into the third memory cells based on the first and second data.

DETAILED DESCRIPTION

Hereinafter, various embodiments of the present invention including a data storage device and an operating method thereof will be described with reference to the accompanying drawings. The present invention may, however, be embodied in different forms and should not be construed as being limited to the embodiments set forth herein, Rather, these embodiments are provided to describe the present invention in detail to the extent that a person skilled in the art to which the invention pertains can practice the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

Figure 1:
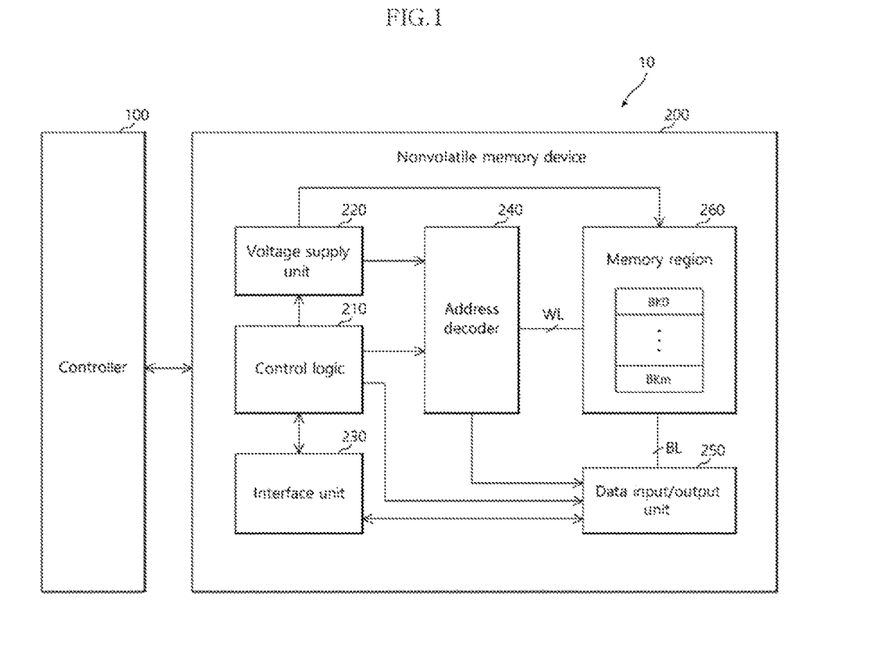
FIG. 1 is a block diagram illustrating a data storage device, including a nonvolatile memory device coupled to a controller, according to an embodiment of the invention.

FIG. 1 is a block diagram illustrating a data storage device 10 according to an embodiment of the invention.

The data storage device 10 may be configured to store data provided from an external device in response to a write request from the external device. Also, the data storage device 10 may be configured to provide stored data to the external device, in response to a read request from the external device.

The data storage device 10 may be or include a Personal Computer Memory Card International Association (PCM-CIA) card, a compact flash (CF) card, a smart media card, a memory stick, a multimedia card (MMC), an embedded MMC (eMMC), a reduced-size multimedia card (RS-MMC) and a micro-size version of MMC (MMC-micro), a secure digital (SD) card, a mini secure digital (mini-SD) and a micro secure digital (micro-SD), a universal flash storage (UFS), a solid state drive (SSD) and the like.

The data storage device 10 may include a controller 100 and a nonvolatile memory device 200. As shown the controller 100 is separate from the nonvolatile memory device 200. However, it is noted that the invention is not limited to such configuration. For example, the controller 100 may be an integral part of the nonvolatile memory device 200.

The controller 100 may control the general operations of the data storage device 10. For example the controller 100 may store data in the nonvolatile memory device 200 in response to a write request transmitted from the external device. The controller 100 may read data stored in the nonvolatile memory device 200 and output the read data to the external device in response to a read request transmitted from the external device.

The controller 100 may perform an error correction operation to data read from target memory cells of the nonvolatile memory device 200. While not shown, the controller 100 may include an ECC (error correction code) unit which is configured to perform an error correction operation to data according to an ECC algorithm.

When an error correction operation to data read from the target memory cells fails or the data read from the target memory cells have a high probability to include an error, the controller 100 may adjust threshold voltages of memory cells which share bit lines with the target memory cells (also referred to as adjustment memory cells), according to the threshold voltages of the target memory cells and adjustment memory cells which are adjacent to the target memory cells.

For example, when the target memory cells have threshold voltages lower than a read voltage and the adjacent memory cells have threshold voltages lower than a reference voltage, the controller 100 may treat the target memory cells as a recovering group and increase the threshold voltages of the adjustment memory cells to a level higher than a first voltage, as will be described later in more detail. In such a case, data read from the target memory cells may include errors and thus the error correction operation to the data read from the target memory cells may fail.

For example, when the target memory cells have threshold voltages higher than the read voltage the controller 100 may treat the target memory cells as a strengthening group and increase the threshold voltages of the adjustment memory cells to a level higher than the first voltage, as will be described later.

For example, when the target memory cells have threshold voltages lower than the read voltage and adjacent memory cells have threshold voltages higher than the reference voltage, the controller 100 may treat the target memory cells as a suppressing group and decrease the threshold voltages of the adjustment memory cells to a level lower than a second voltage, as will also be described later in more detail.

The controller 100 may acquire first data from the target memory cells, acquire second data from the adjacent memory cells, generate third data based on the first data and the second data, and adjust threshold voltages of the adjustment memory cells by storing the third data in the adjustment memory cells. In order to store the third data in the adjustment memory cells, the controller 100 may copy data currently stored in the adjustment memory cells, erase the adjustment memory cells and store the third data in the adjustment memory cells. According to an embodiment, the controller 100 may store the third data in the adjustment memory cells through a reprogram operation which is well-known in the related art.

After adjusting the threshold voltages of the adjustment memory cells the controller 100 may read the data from the target memory cells. The data read from the target memory cells after the adjustment of the threshold voltages of the adjustment memory cells may include fewer error bits than data read from the target memory cells before the adjustment of the threshold voltages of the adjustment memory cells. This is because at least some error bits of the data read from the target memory cells before the adjustment of the threshold voltages of the adjustment memory cells are corrected through the adjustment of the threshold voltages of the adjustment memory cells. Therefore, an error correction operation to data read from the target memory cells after the adjustment of the threshold voltages of the adjustment memory cells may have an improved likelihood to succeed.

The nonvolatile memory device 200 may be or include a flash memory device, such as NAND flash or NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM) and the like. The nonvolatile memory device 200 may store data transmitted from the controller 100 and may read stored data and transmit read data to the controller 100, according to control of the controller 100.

The nonvolatile memory device 200 may include a control logic 210, a voltage supply unit 220, an interface unit 230, an address decoder 240 a data input/output unit 250 and a memory region 260.

The control logic 210 may control the general operations of the nonvolatile memory device 200 according to control of the controller 100. The control logic 210 may receive a command transmitted from the controller 100 via the interface unit 230, and may transmit control signals to internal units of the nonvolatile memory device 200 in response to the command.

The voltage supply unit 220 may generate various operation voltages necessary for the general operations of the nonvolatile memory device 200, according to control of the control logic 210. For example, the voltage supply unit 220 may supply various voltages to be used in a write operation or a read operation to the address decoder 240. For example, the voltage supply unit 220 may supply an erase voltage necessary for an erase operation, to a memory block selected in the memory region 260.

The interface unit 230 may exchange various control signals including commands and addresses and data with the controller 100. The interface unit 230 may transmit various control signals and data inputted thereto, to the internal units of the nonvolatile memory device 200.

The address decoder 240 may decode addresses to select portions to be accessed in the memory region 260. The address decoder 240 may selectively drive word lines WL and control the data input/output unit 250 to selectively drive bit lines BL, according to decoding results.

The data input/output unit 250 may transmit data transmitted from the interface unit 230, to the memory region 260 through the bit lines BL. The data input/output unit 250 may transmit data read from the memory region 260 through the bit lines BL, to the interface unit 230. The data input/output unit 250 may sense current formed as memory cells included in the memory region 260 are turned on and off in response to a read voltage, and may acquire data read from the memory cells, according to sensing results.

The memory region 260 may be coupled with the address decoder 240 through the word lines WL, and may be coupled with the data input/output unit 250 through the bit lines BL.

The memory region 260 may include a plurality of memory cells which are respectively disposed at areas where the word lines WL and the bit lines BL intersect with each other and in which data are stored. The memory region 260 may include memory cell arrays of a two-dimensional or three-dimensional structure. The memory region 260 may include a plurality of memory blocks BK0 to BKm.

Figure 2:
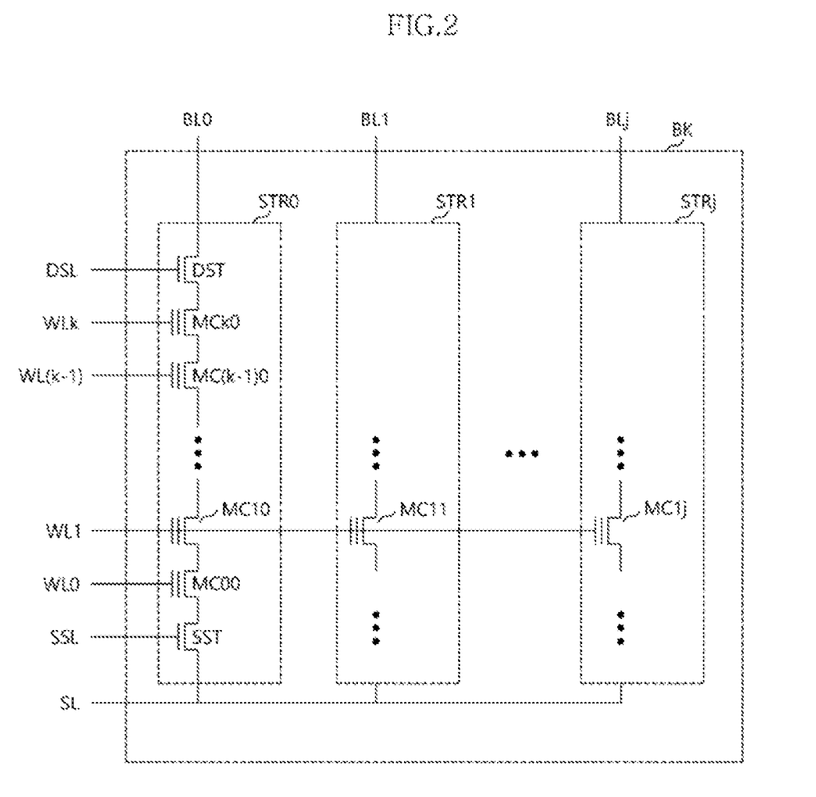
FIG. 2 is a detailed diagram illustrating a memory block of the memory device of FIG. 1, according to an embodiment of the invention.

FIG. 2 is a detailed diagram illustrating a memory block BK. The memory blocks BK0 to BKm shown in FIG. 1 may be configured in substantially the same way as the memory block BK.

The memory block BK may include strings STR0 to STR0. Each of the strings STR0 to STRj may be coupled between a source line SL and a corresponding bit line, For example the string STR0 may be coupled between the source line SL and a bit line BL0.

The strings STR1 to STRj may be configured in substantially the same way as the string STR0, and therefore, the string STR0 will be described as an example. The string STR0 may include a drain select transistor DST, memory cells MC00 to MCk0, and a source select transistor SST. The drain select transistor DST may have a drain which is coupled to the bit line BL0 and a gate which is coupled to a drain select line DSL. The source select transistor SST may have a source which is coupled to the source line SL and a gate which is coupled to a source select line SSL. The memory cells MC00 to MCk0 may be coupled in series between the drain select transistor DST arid the source select transistor SST. Gates of the memory cells MC00 to MCk0 may be coupled to word lines WL0 to WLk, respectively.

Each of the word lines WL0 to WLk may be coupled to corresponding memory cells of the strings STR0 to STRj. For example, the word line WL1 may be coupled to memory cells MC10 to MC1j which are included in the strings STR0 to STRj, respectively. Memory cells may be written when corresponding word lines are selected in a write operation. The memory cells MC10 to MC1j may be written simultaneously when the word line WL1 is selected in the write operation.

Each word line may correspond to a plurality of pages according to the number of data bits which are to be stored in each memory cell, For example, when 1 bit is stored in each memory cell, each word line may correspond to one page. When 2 bits, that is LSB (least significant bit) data and MSB most significant bit) data are stored in each memory cell, each word line may correspond to LSB and MSB pages in which the LSB and MSB data are respectively stored. When 3 bits, that is, LSB data, CSB (central significant bit) data and MSB data are stored in each memory cell, each word line may correspond to LSB, CSB and MSB pages in which the LSB, CSB and MSB data are respectively stored.

Figure 3A:
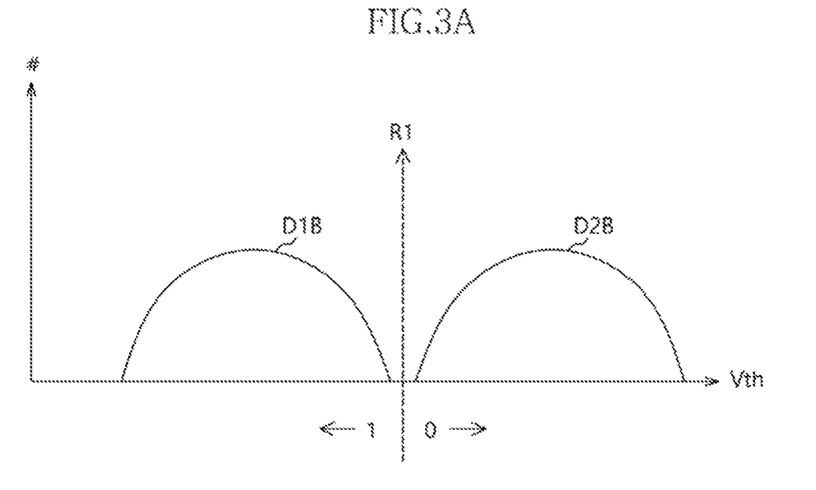
FIGS. 3A and 3B are graphs illustrating examples of threshold voltage distributions of memory cells of a memory device, according to an embodiment of the invention.
Figure 3B:
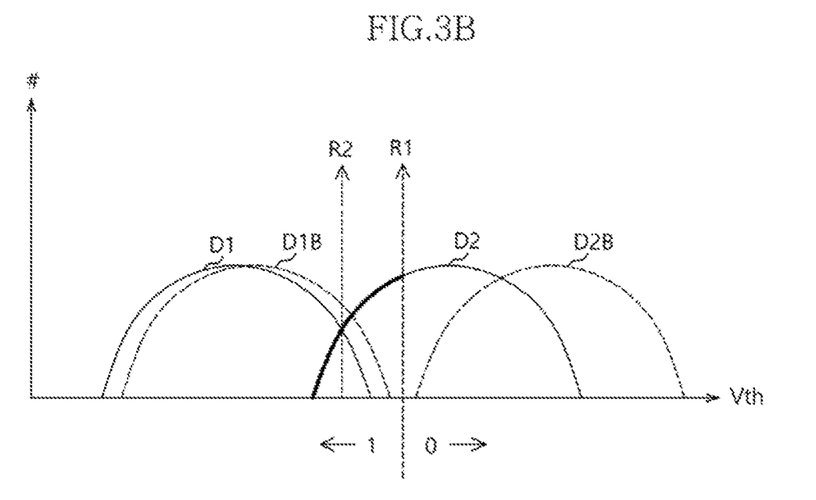

FIGS. 3A and 3B are graphs illustrating examples of threshold voltage distributions D1B, D2B, D1 and D2 of memory cells. In the threshold voltage distributions D1B, D2B, D1 and D2, a horizontal axis Vth represents a threshold voltage of a memory cell, and a vertical axis # represents the number of memory cells corresponding to a threshold voltage.

Referring to FIG. 3A, erased memory cells may form the threshold voltage distribution D1B. Memory cells may form the threshold voltage distributions D1B and D2B according to data stored therein through a write operation. A memory cell stored with data may be turned on or off according to a predetermined read voltage R1 which is applied through a corresponding word line. A memory cell having a threshold voltage forming the threshold voltage distribution D1B may be turned on since the read voltage R1 is higher than its threshold voltage. A memory cell having a threshold voltage forming the threshold voltage distribution D2B may be turned off since the read voltage R1 is lower than its threshold voltage. The read voltage R1 may be set to identify the threshold voltage distributions D1B and D2B. The turned-on memory cell according to the read voltage R1 may be determined to store data "1" while the turned-off memory cell according to the read voltage R1 may be determined to store data "0". The turning-on or off of the memory cell may be sensed by current running through the memory cell at the application of the read voltage R1. Therefore, the threshold voltage of a memory cell may be identified through data read according to an appropriate read voltage.

According to an embodiment, when at least 2 bits are stored in each memory cell, memory cells may form a plurality of threshold voltage distributions according to data stored therein. The plurality of threshold voltage distributions may be discriminated through a plurality of read voltages. Data stored in the memory cells may be read according to the plurality of read voltages.

Referring to FIG. 3B, threshold voltages of memory cells may vary due to various reasons. For example, charges introduced into floating gates when data are stored in memory cells may be discharged with the lapse of time, and accordingly, threshold voltages of the memory cells may be decreased. In this case, the threshold voltage distributions D1B and D2B may be shifted to be threshold voltage distributions D1 and D2, respectively. Such a retention issue of memory cells may become more serious as adjacent memory cells have lower threshold voltages. Adjacent memory cells may be coupled to word lines which are adjacent to each other.

Meanwhile, memory cells corresponding to the thick solid line in the threshold voltage distribution D2 may output error data according to the read voltage R1. When read data include error bits exceeding the error correction capability of an ECC unit, the error correction operation to the read data may fail.

In order to minimize error bits in the read data and succeed in the error correction operation to the read data, the read operation may be performed by setting an optimal read voltage R2 for the shifted threshold voltage distributions D1 and D2. The optimal read voltage R2 may preferably have a value at the cross point between the shifted threshold voltage distributions D1 and D2. The number of error bits may be minimized by applying the optimal read voltage R2. However, when data read from memory cells based on the new read voltage R2 still include error bits exceeding the error correction capability of the ECC unit, the error correction operation of the controller 100 may fail again.

Figure 4:
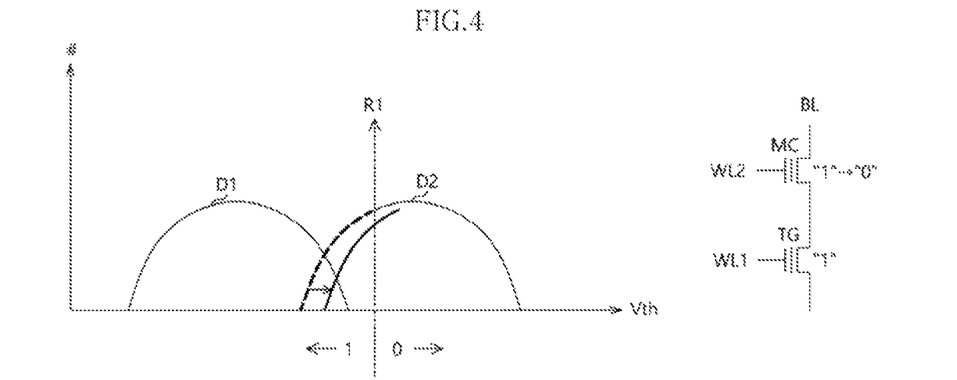
FIGS. 4 to 6 are diagrams illustrating a method for operating the controller of FIG. 1, according to an embodiment of the invention.
Figure 5:
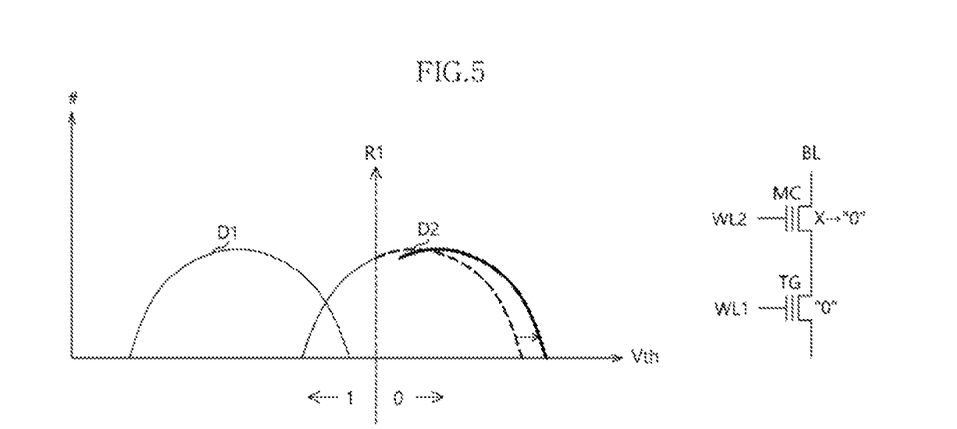
Figure 6:
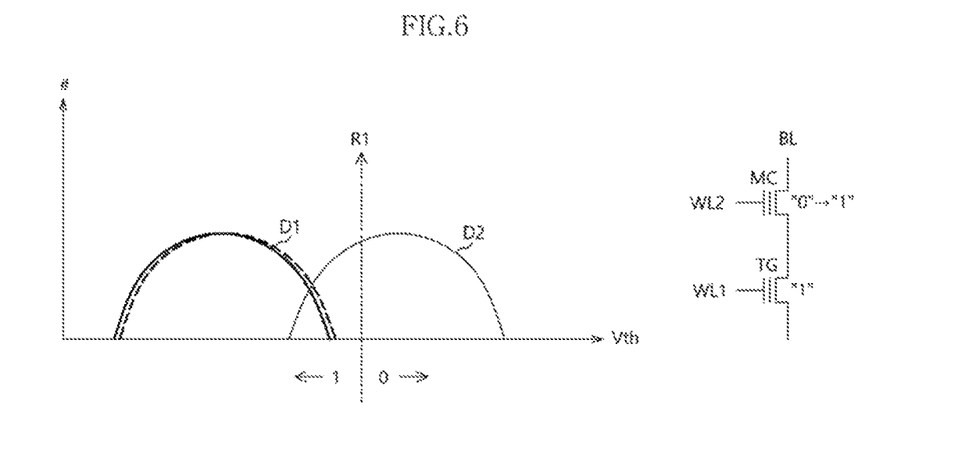

FIGS. 4 to 6 are examples of diagrams illustrating a method for operating the controller 100 of FIG. 1. FIGS. 4 to 6 illustrate shifted threshold voltage distributions D1 and D2 of a target memory cell coupled to a single word line WL1.

FIGS. 4 to 6 illustrate the target memory cell TG coupled to the word line WL1. One of the adjustment memory cells MCs sharing a bit line BL with the target memory cell TG may be coupled to a word line WL2.

Also, FIGS. 4 to 6 illustrate the adjacent memory cell MC coupled to the word line WL2 adjacent to the target memory cell TG among the adjustment memory cells MCs. The adjacent memory cell MC may also be coupled to the other word line adjacent to the word line WL1 of the target memory cell TG.

In practice, the bit line current is sometimes affected not only by the threshold voltage of the target memory cell, but also by the charge levels of other cells such as the adjustment memory cells in the same bit line. As a result, sensed bit line current may be distorted and may not truly reflect the charge level of the target memory cell. The distortion caused to the sensed threshold voltage of the target memory cell by charge levels of unselected cells such as the adjustment memory cells in the same bit line is referred to as the Back Pattern Dependency (BPD). Due to the BPD, the threshold voltage of the target memory cell may be artificially changed when the threshold voltages of the adjustment memory cells are changed.

The controller 100 may alleviate the retention issue through the BPD when the error correction operation to data read from the target memory cells fails or the data read from the target memory cells have a high probability to include an error. As will be described later, in order to induce the BPD in the target memory cell, the controller 100 may increase the threshold voltage of the adjustment memory cell. Further, in order to suppress the BPD in the target memory cell, the controller 100 may decrease the threshold voltage of the adjustment memory cells. The controller 100 may adjust the threshold voltage of the adjustment memory cells by storing new data in the adjustment memory cells.

The target memory cells will be classified into a recovering group, a strengthening group and a suppressing group according to whether the BPD is to be induced or suppressed in corresponding target memory cells, as will be described below through FIGS. 4 to 11.

Referring to FIG. 4, the target memory cells corresponding to the dotted line in the threshold voltage distribution D2 are defined as the recovering group. The recovering group may correspond to the dotted line in the threshold voltage distribution D2 with a high probability.

When the target memory cell has a threshold voltage lower than the read voltage R1 and the adjacent memory cell has a threshold voltage lower than a reference voltage, which is determined based on the first data (i.e., data of value "1") read from the target memory cell TG and the second data (i.e., data of value "1") read from the adjacent memory cell MC, the target memory cell may be classified as belonging in the recovering group. For example, when the adjacent memory cell MC forms a lower threshold voltage distribution (i.e., the threshold voltage distribution D1B of FIG. 3A), the adjacent memory cell MC may have a threshold voltage lower than the reference voltage.

The reference voltage as the threshold voltages of the adjacent memory cells may aggravate the retention issue in the target memory cell. When the adjacent memory cell has a lower threshold voltage than the reference voltage, the retention issue may worsen and the probability of the target memory cell to correspond to the dotted line in the threshold voltage distribution D2 may be high. Therefore, in this case, the target memory cell may be classified in the recovering group.

For example, based on data "1" read from the target memory cell TG, the controller 100 may determine that the target memory cell TG has a threshold voltage lower than the read voltage R1. Moreover, based on data "1" read from the adjacent memory cell MC, the controller 100 may determine that the adjacent memory cell MC has a threshold voltage lower than the reference voltage. Accordingly, the controller 100 may treat the target memory cell TG as the recovering group.

In order to induce the BPD in the recovering group, the controller 100 may increase the threshold voltages of the adjustment memory cells, which are coupled to the same bit line as the recovering group to a level higher than the first voltage. The first voltage or higher as the threshold voltages of the adjustment memory cells may induce the BPD in the target memory cells. For example, the controller 100 may newly store data (i.e. data of value "0") corresponding to an upper threshold voltage distribution (i.e., the threshold voltage distribution D2B of FIG. 3A) in the adjustment memory cells corresponding to the recovering group. The storage of the data corresponding to the upper threshold voltage distribution into the adjustment memory cells may allow the adjustment memory cells to form the upper threshold voltage distribution (e.g., the threshold voltage distribution D2B of FIG. 3A).

The target memory cells of the recovering group, which actually correspond to the dotted line of FIG. 4, may artificially operate as if they correspond to the thick solid line due to the BPD caused by the first voltage or higher as the threshold voltages of the adjustment memory cells. Therefore, since data read from the target memory cells according to the read voltage R1 after the adjustment of the threshold voltages of the adjustment memory cells may include fewer error bits than before the adjustment of the threshold voltages of the adjustment memory cells, the error correction operation to the read data after the adjustment of the threshold voltages of the adjustment memory cells may have an improved likelihood to succeed.

According to an embodiment, the controller 100 may control the nonvolatile memory device 200 to perform the reprogram operation to the adjustment memory cells MC in order to newly store data (i.e., data of "0") corresponding to the upper threshold voltage distribution (i.e., the threshold voltage distribution D2B of FIG. 3A) in the adjustment memory cell MC.

As described above, the controller 100 may treat the target memory cells as the recovering group based on the first and second data respectively read from the target memory cells and the adjacent memory cells according to the read voltage R1. The first data read from the target memory cell according to the read voltage R1 before the adjustment of the threshold voltages of the adjustment memory cells may be the error data, to which the error correction operation fails.

Referring to FIG. 5, the target memory cells corresponding to the dotted line in the threshold voltage distribution D2 are defined as the strengthening group. When the target memory cell has the threshold voltage higher than the read voltage R1, which is determined based on the first data (i.e., data of value "0") read from the target memory cell TG regardless of the threshold voltage of the adjacent memory cell MC, the target memory cell may be the strengthening group. Accordingly, the controller 100 may treat the target memory cell TG as the strengthening group as follows, In order to induce the BPD in the strengthening group, the controller 100 may increase the threshold voltages of the adjustment memory cells which are coupled to the same bit line as the strengthening group, to a level higher than the first voltage. The first voltage or higher as the threshold voltages of the adjustment memory cells may induce the BPD in the target memory cells. For example, the controller 100 may newly store data (i.e. data of value "0") corresponding to an upper threshold voltage distribution (i.e., the threshold voltage distribution D2B of FIG. 3A) in the adjustment memory cells corresponding to the strengthening group. The storage of the data corresponding to the upper threshold voltage distribution into the adjustment memory cells may allow the adjustment memory cells to form the upper threshold voltage distribution (e.g., the threshold voltage distribution D2B of FIG. 3A).

The target memory cells of the strengthening group, which actually correspond to the dotted line of FIG. 5, may artificially operate as if they correspond to the thick solid line due to the BPD caused by the first voltage or higher as the threshold voltages of the adjustment memory cells. Therefore, since data read from the target memory cells according to the read voltage R1 after the adjustment of the threshold voltages of the adjustment memory cells may include fewer error bits with higher probability than before the adjustment of the threshold voltages of the adjustment memory cells, the error correction operation to the read data after the adjustment of the threshold voltages of the adjustment memory cells may have an improved likelihood to succeed with higher success rate.

According to an embodiment, the controller 100 may control the nonvolatile memory device 200 to perform the reprogram operation to the adjustment memory cells MC in order to newly store data (i.e. data of "0") corresponding to the upper threshold voltage distribution (i.e., the threshold voltage distribution D2B of FIG. 3A) in the adjustment memory cell MC.

According to an embodiment, in order to secure an improved read margin between the threshold voltage distributions D1 and D2 and therefore to reduce the number of error bits included in the data read from the target memory cells, the controller 100 may induce the BPD in the recovering group and the strengthening group.

Referring to FIG. 6, the target memory cells corresponding to the dotted line in the threshold voltage distribution D1 are defined as the suppressing group. In detail, when the target memory cell has the threshold voltage lower than the read voltage R1 and the adjacent memory cell has a threshold voltage higher than the reference voltage, which is determined based on the first data (i.e., data of value "1") read from the target memory cell TG and the second data (i.e., data of value "0") read from the adjacent memory cell MC, the target memory cell may be the suppressing group. Accordingly, the controller 100 may treat the target memory cell TG as the suppressing group as follows.

In order to suppress the BPD in the suppressing group, the controller 100 may decrease the threshold voltages of the adjustment memory cells, which are coupled to the same bit line as the suppressing group, to a level lower than a second voltage. The second voltage or lower as the threshold voltages of the adjustment memory cells may suppress the BPD in the target memory cells. For example, the controller 100 may newly store data (i.e. data of value "1") corresponding to the lower threshold voltage distribution (i.e., the threshold voltage distribution D1B of FIG. 3A) in the adjustment memory cells corresponding to the suppressing group. The storage of the data corresponding to the lower threshold voltage distribution into the adjustment memory cells may allow the adjustment memory cells to form the lower threshold voltage distribution (e.g., the threshold voltage distribution D1B of FIG. 3A).

The target memory cells of the suppressing group, which actually correspond to the dotted line of FIG. 6, may artificially operate as if they correspond to the thick solid line due to the BPD suppressed by the second voltage or lower as the threshold voltages of the adjustment memory cells. Therefore, since data read from the target memory cells according to the read voltage R1 after the adjustment of the threshold voltages of the adjustment memory cells may include fewer error bits with higher probability than before the adjustment of the threshold voltages of the adjustment memory cells, the error correction operation to the read data after the adjustment of the threshold voltages of the adjustment memory cells may have an improved likelihood to succeed with higher success rate.

According to an embodiment, the controller 100 may control the nonvolatile memory device 200 to perform the reprogram operation to the adjustment memory cells MC in order to newly store data (i.e., data of "1") corresponding to the lower threshold voltage distribution (i.e., the threshold voltage distribution D1B of FIG. 3A) in the adjustment memory cell MC.

According to an embodiment, for securing an improved read margin between the threshold voltage distributions D1 and D2 and thereby reducing the number of error bits included in the data read from the target memory cells, the controller 100 may suppress the BPD in the suppressing group.

According to an embodiment, when a plurality of threshold voltage distributions are formed according to the number of bits to be stored in each memory cell, the retention issue may be alleviated according to the above-described methods, in relation with 2 optional threshold voltage distributions which are adjacent to each other. According to an embodiment, in order to induce the BPD, the controller 100 may adjust the threshold voltages of adjustment memory cells to correspond to an uppermost threshold voltage distribution among the plurality of threshold voltage distributions. According to an embodiment, in order to suppress the BPD, the controller 100 may adjust the threshold voltages of adjustment memory cells to correspond to a lowest threshold voltage distribution among the plurality of threshold voltage distributions.

Figure 7:
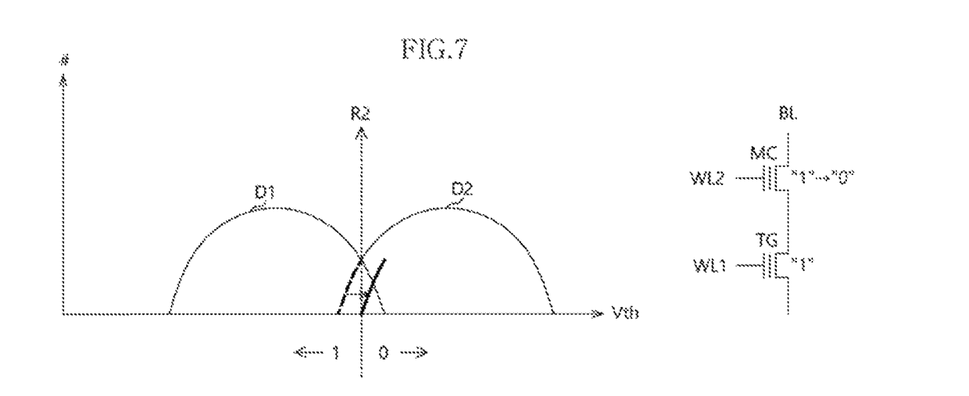
FIGS. 7 to 9 are diagrams illustrating another method for operating the controller of FIG. 1 according to another embodiment of the invention.
Figure 8:
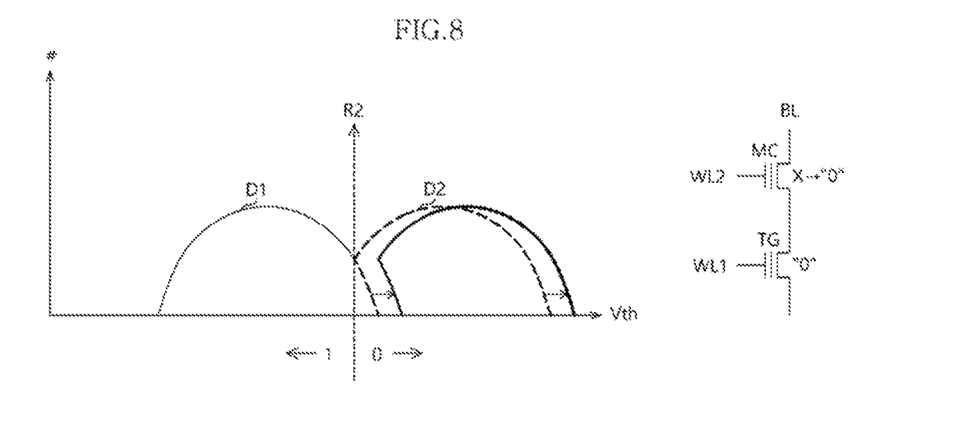
Figure 9:
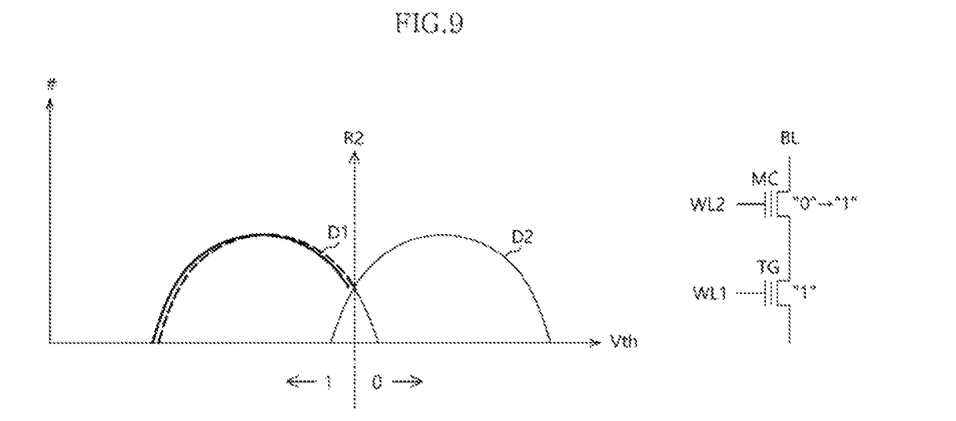

FIGS. 7 to 9 are examples of diagrams illustrating a method for operating the controller 100 of FIG. 1. The structure of the target memory cells TG, the adjustment memory cells and the adjacent memory cells MCs of FIGS. 7 to 9 may be the same as FIGS. 4 to 6.

The controller 100 may alleviate the retention issue through the BPD, when the error correction operation to the data read from target memory cells fails or the data read from the target memory cells have a high probability to include an error according to an optimal read voltage R2. Similarly to the embodiment described with reference to FIGS. 4 to 6, in order to induce the BPD in the target memory cell, the controller 100 may increase the threshold voltage of the adjustment memory cell. Further, in order to suppress the BPD in the target memory cell, the controller 100 may decrease the threshold voltage of the adjustment memory cells. The controller 100 may adjust the threshold voltage of the adjustment memory cell by storing new data in the adjustment memory cell.

The target memory cells will be classified into the recovering group, the strengthening group and the suppressing group according to whether the BPD is to be induced or suppressed in corresponding target memory cells, which is determined on the basis of the optimal read voltage R2.

Referring to FIG. 7, the target memory cells corresponding to the dotted line in the threshold voltage distribution D2 are defined as the recovering group. The recovering group may correspond to the dotted line in the threshold voltage distribution D2 with a high probability.

When the target memory cell TG has the threshold voltage lower than the optimal read voltage R2 and the adjacent memory cell MC has the threshold voltage lower than a reference voltage, which is determined based on the first data (i.e., data of value "1") read from the target memory cell TG and the second data (i.e., data of value "0") read from the adjacent memory cell MC, the target memory cell may be the recovering group. For example, when the adjacent memory cell MC forms a lower threshold voltage distribution (i.e., the threshold voltage distribution D1B of FIG. 3A), the adjacent memory cell MC may have the threshold voltage lower than the reference voltage.

Using the reference voltage as the threshold voltages of the adjacent memory cells may aggravate the retention issue in the target memory cell.

For example, based on data read from the target memory cell TG, the controller 100 may determine that the target memory cell TG has the threshold voltage lower than the optimal read voltage R2. Moreover, based on data "1" read from the adjacent memory cell MC, the controller 100 may determine that the adjacent memory cell MC has the threshold voltage lower than the reference voltage. Accordingly, the controller 100 may treat the target memory cell TG as the recovering group as follows.

In order to induce the BPD in the recovering group, the controller 100 may increase the threshold voltages of the adjustment memory cells, which are coupled to the same bit line as the recovering group, to a level higher than the first voltage. The first voltage or higher as the threshold voltages of the adjustment memory cells may induce the BPD in the target memory cells. For example, the controller 100 may newly store data (i.e. data of value "0") corresponding to an upper threshold voltage distribution (i.e., the threshold voltage distribution D2B of FIG. 3A) in the adjustment memory cells corresponding to the recovering group. The storage of the data corresponding to the upper threshold voltage distribution into the adjustment memory cells may allow the adjustment memory cells to form the upper threshold voltage distribution (e.g., the threshold voltage distribution D2B of FIG. 3A).

The target memory cells of the recovering group, which actually correspond to the dotted line of FIG. 7 may artificially operate as if they correspond to the thick solid line due to the BPD caused by the first voltage or higher as the threshold voltages of the adjustment memory cells. Therefore, since data read from the target memory cells according to the optimal read voltage R2 after the adjustment of the threshold voltages of the adjustment memory cells may include fewer error bits than before the adjustment of the threshold voltages of the adjustment memory cells, the error correction operation to the read data after the adjustment of the threshold voltages of the adjustment memory cells may have an improved likelihood to succeed.

According to an embodiment, the controller 100 may control the nonvolatile memory device 200 to perform the reprogram operation to the adjustment memory cells MC in order to newly store data (i.e., data of "0") corresponding to the upper threshold voltage distribution (i.e., the threshold voltage distribution D2B of FIG. 3A) in the adjustment memory cell MC.

As described above, the controller 100 may treat the target memory cells as the recovering group based on the first and second data respectively read from the target memory cells and the adjacent memory cells according to the optimal read voltage R2. The first data read from the target memory cell according to the optimal read voltage R2 before the adjustment of the threshold voltages of the adjustment memory cells may be the error data, to which the error correction operation fails.

Referring to FIG. 8, the target memory cells corresponding to the dotted line in the threshold voltage distribution D1 and D2 are defined as the strengthening group. When the target memory cell has a threshold voltage higher than the optimal read voltage R2, which is determined based on the first data (i.e., data of value "0") read from the target memory cell TG regardless of the threshold voltage of the adjacent memory cell MC, the target memory cell may be the strengthening group. Accordingly, the controller 100 may treat the target memory cell TG as the strengthening group as follows.

In order to induce the BPD in the strengthening group, the controller 100 may increase the threshold voltages of the adjustment memory cells which are coupled to the same bit line as the strengthening group to a level higher than the first voltage. The first voltage or higher as the threshold voltages of the adjustment memory cells may induce the BPD in the target memory cells. For example, the controller 100 may newly store data (i.e. data of value "0") corresponding to an upper threshold voltage distribution (i.e., the threshold voltage distribution D2B of FIG. 3A) in the adjustment memory cells corresponding to the strengthening group. The storage of the data corresponding to the upper threshold voltage distribution into the adjustment memory cells may allow the adjustment memory cells to form the upper threshold voltage distribution (e.g., the threshold voltage distribution D2B of FIG. 3A).

The target memory cells of the strengthening group, which actually correspond to the dotted line of FIG. 8, may artificially operate as if they correspond to the thick solid line due to the BPD caused by the first voltage or higher as the threshold voltages of the adjustment memory cells. Therefore, since data read from the target memory cells according to the optimal read voltage R2 after the adjustment of the threshold voltages of the adjustment memory cells may include fewer error bits with higher probability than before the adjustment of the threshold voltages of the adjustment memory cells, the error correction operation to the read data after the adjustment of the threshold voltages of the adjustment memory cells may have an improved likelihood to succeed with higher success rate.

According to an embodiment, the controller 100 may control the nonvolatile memory device 200 to perform the reprogram operation to the adjustment memory cells MC in order to newly store data (i.e., data of "0") corresponding to the upper threshold voltage distribution (i.e., the threshold voltage distribution D2B of FIG. 3A) in the adjustment memory cell MC.

According to an embodiment, in order to secure an improved read margin between the threshold voltage distributions D1 and D2 and therefore to reduce the number of error bits included in the data read from the target memory cells, the controller 100 may induce the BPD in the recovering group and the strengthening group.

Meanwhile, in FIG. 8, data read from the target memory cells corresponding to the dotted line in the threshold voltage distribution D1 may still have an error despite of the adjustment of the threshold voltages of the adjustment memory cells. Nevertheless, when the BPD is induced in both the recovering group and the strengthening group as described above with reference to FIGS. 7 and 8, the total number of error bits may be decreased and an improved read margin may be secured, and thus, the adjustment operation may be effective.

Referring to FIG. 9, the target memory cells corresponding to the dotted line in the threshold voltage distribution D1 are defined as the suppressing group. In detail, when the target memory cell has the threshold voltage lower than the optimal read voltage R2 and the adjacent memory cell has a threshold voltage higher than the reference voltage, which is determined based on the first data (i.e., data of value "1") read from the target memory cell TG and the second data (i.e., data of value "0") read from the adjacent memory cell MC, the target memory cell may be the suppressing group. Accordingly, the controller 100 may treat the target memory cell TG as the suppressing group as follows.

In order to suppress the BPD in the suppressing group, the controller 100 may decrease the threshold voltages of the adjustment memory cells which are coupled to the same bit line as the suppressing group, to a level lower than a second voltage. The second voltage or lower as the threshold voltages of the adjustment memory cells may suppress the BPD in the target memory cells. For example, the controller 100 may newly store data (i.e. data of value "1") corresponding to a lower threshold voltage distribution (i.e., the threshold voltage distribution D1B of FIG. 3A) in the adjustment memory cells corresponding to the suppressing group. The storage of the data corresponding to the lower threshold voltage distribution into the adjustment memory cells may allow the adjustment memory cells to form the lower threshold voltage distribution (e.g., the threshold voltage distribution D1B of FIG. 3A).

The target memory cells of the suppressing group, which actually correspond to the dotted line of FIG. 9, may artificially operate as if they correspond to the thick solid line due to the BPD suppressed by the second voltage or lower as the threshold voltages of the adjustment memory cells. Therefore, since data read from the target memory cells according to the optimal read voltage R2 after the adjustment of the threshold voltages of the adjustment memory cells may include fewer error bits with higher probability than before the adjustment of the threshold voltages of the adjustment memory cells, the error correction operation to the read data after the adjustment of the threshold voltages of the adjustment memory cells may have an improved likelihood to succeed with higher success rate.

According to an embodiment, the controller 100 may control the nonvolatile memory device 200 to perform the reprogram operation to the adjustment memory cells MC in order to newly store data (i.e., data of "1") corresponding to the lower threshold voltage distribution i.e., the threshold voltage distribution D1B of FIG. 3A) in the adjustment memory cell MC.

According to an embodiment, for securing an improved read margin between the threshold voltage distributions D1 and D2 and therefore to reduce the number of error bits included in the data read from the target memory cells, the controller 100 may suppress the BPD in the suppressing group.

According to an embodiment, when a plurality of threshold voltage distributions are formed according to the number of bits to be stored in each memory cell, the retention issue may be alleviated according to the above-described methods, in relation with 2 optional threshold voltage distributions which are adjacent to each other. According to an embodiment, in order to induce the BPD, the controller 100 may adjust the threshold voltages of adjustment memory cells to correspond to an uppermost threshold voltage distribution among the plurality of threshold voltage distributions. According to an embodiment, in order to suppress the BPD, the controller 100 may adjust the threshold voltages of adjustment memory cells to correspond to a lowest threshold voltage distribution among the plurality of threshold voltage distributions.

Figure 10:
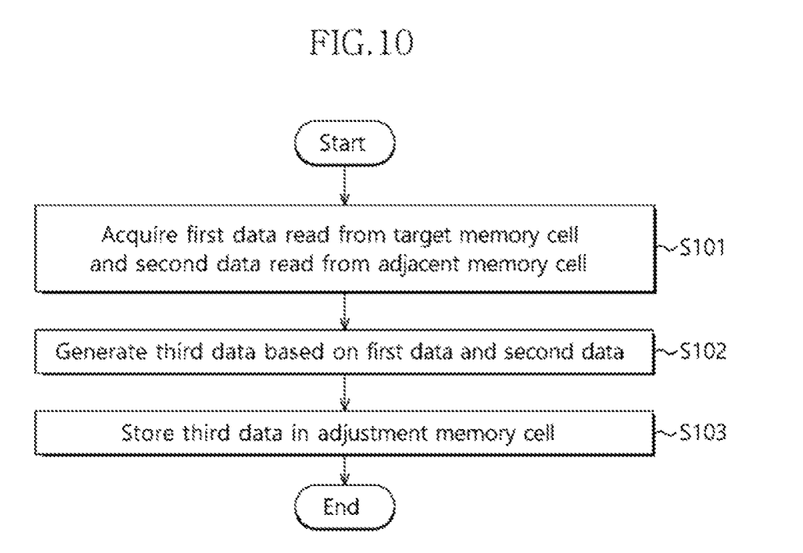
FIG. 10 is a flow chart illustrating a method for operating the controller of FIG. 1, according to an embodiment of the invention.

FIG. 10 is a flow chart illustrating a method for operating the controller 100 of FIG. 1.

At step S101, the controller 100 may acquire the first data read from the target memory cell, and acquire the second data read from the adjacent memory cell adjacent to the target memory cell. The controller 100 may control the nonvolatile memory device 200 to acquire the first data from the target memory cell. The controller 100 may also control the nonvolatile memory device 200 to acquire the second data from the adjacent memory cell.

At step S102, the controller 100 may generate a third data based on the first data and the second data. A concrete method for the controller 100 to generate the third data will be described in detail with reference to FIG. 11.

At step S103, the controller 100 may store the third data in the adjustment memory cell, which shares a bit line with the target memory cell, through the reprogram operation to the adjustment memory cell. The storage of the third data into the adjustment memory cell may cause the adjustment of the threshold voltages of the adjustment memory cells and thus the BPD may be induced or suppressed in the target memory cell.

According to an embodiment, an improved read margin between the threshold voltage distributions D1 and D2 may be secured and therefore the number of error bits included in the data read from the target memory cells may be reduced through the treating of the target memory cells as one of the recovering group, the strengthening group and the suppressing group as follows.

Figure 11:
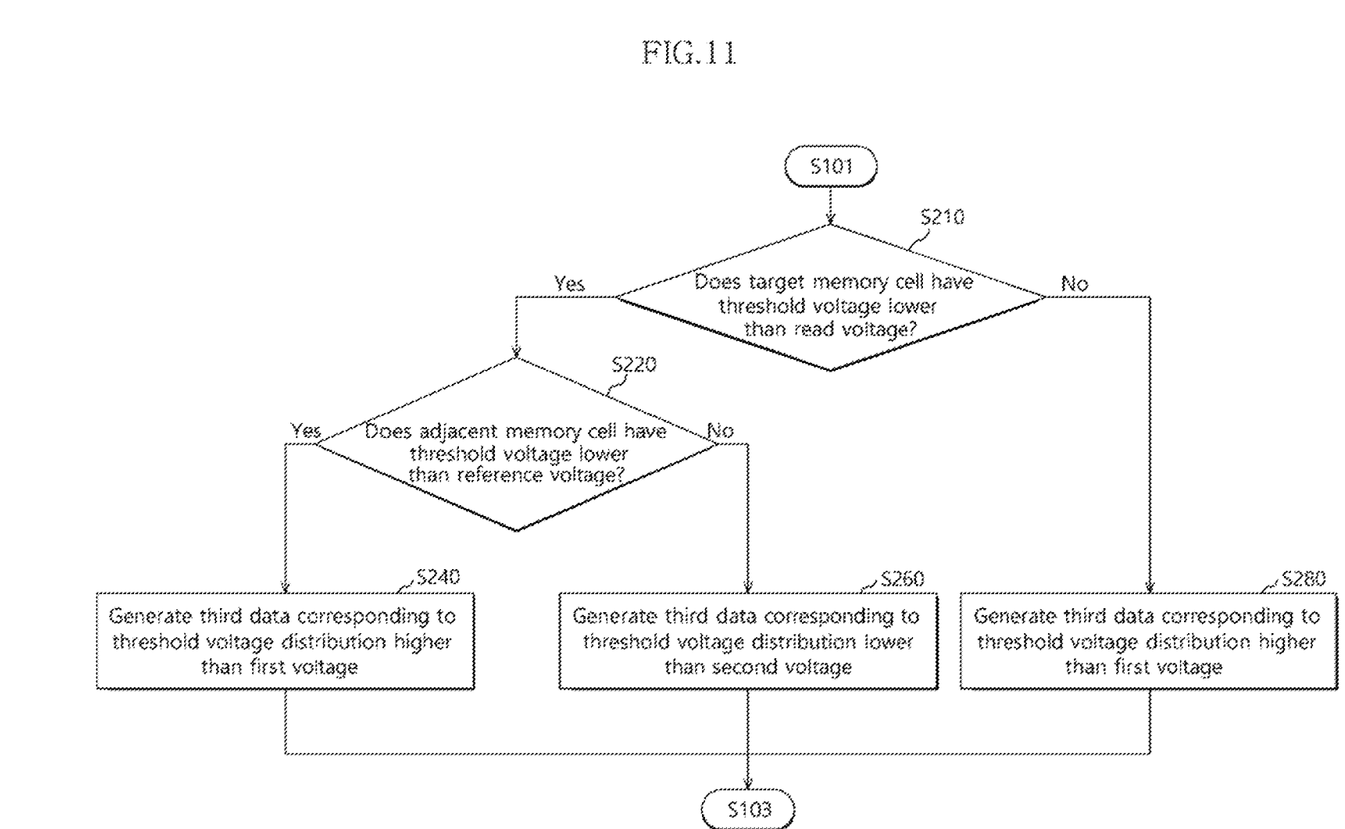
FIG. 11 is a flow chart illustrating a method for the controller of FIG. 1 to generate third data to be stored in an adjustment memory cell, according to an embodiment of the invention.

FIG. 11 is a flow chart illustrating a method for the controller 100 of FIG. 1 to generate the third data to be stored in the adjustment memory cell. The operating method shown in FIG. 11 may be an example of the step S102 of FIG. 10.

At step S210, the controller 100 may determine based on the first data read from the target memory cell whether the target memory cell has the threshold voltage lower than the read voltage R1 or R2. When the target memory cell has the threshold voltage lower than the read voltage R1 or R2 the process may proceed to step S220.

At step S220, the controller 100 may determine based on the second data read from the adjacent memory cell whether the adjacent memory cell has a threshold voltage lower than the reference voltage. When the adjacent memory cell has a threshold voltage lower than the reference voltage, the controller 100 may treat the target memory cell TG as the recovering group at step S240.

At step S240, the controller 100 may increase the threshold voltages of the adjustment memory cells, which are coupled to the same bit line as the recovering group, to a level higher than the first voltage in order to induce the BPD in the recovering group by generating the third data (i.e., the third data of value "0") corresponding to the upper threshold voltage distribution (i.e. the threshold voltage distribution D2B of FIG. 3A). Using the first voltage or a higher voltage as the threshold voltages of the adjustment memory cells may induce the BPD in the target memory cells. At step S103, the storage of the third data corresponding to the upper threshold voltage distribution into the adjustment memory cells may allow the adjustment memory cells to form the upper threshold voltage distribution (e.g., the threshold voltage distribution D2B of FIG. 3A).

At step S220, when the adjacent memory cell has a threshold voltage higher than the reference voltage, the controller 100 may treat the target memory cell TG as the suppressing group at step S260.

At step S260, the controller 100 may decrease the threshold voltages of the adjustment memory cells, which are coupled to the same bit line as the suppressing group, to a level lower than the second voltage in order to suppress the BPD in the suppressing group by generating the third data (i.e., the third data of value "1") corresponding to the lower threshold voltage distribution (i.e., the threshold voltage distribution D1B of FIG. 3A). Using the second voltage or a lower voltage as the threshold voltages of the adjustment memory cells may suppress the BPD in the target memory cells. At step S103, the storage of the data corresponding to the lower threshold voltage distribution into the adjustment memory cells may allow the adjustment memory cells to form the lower threshold voltage distribution (e.g., the threshold voltage distribution D1B of FIG. 3A).

At step S210, when the target memory cell has a threshold voltage higher than the read voltage R1 or R2, the controller 100 may treat the target memory cell TG as the strengthening group at step S280.

At step S280, the controller 100 may increase the threshold voltages of the adjustment memory cells, which are coupled to the same bit line as the recovering group, to a level higher than the first voltage in order to induce the BPD in the recovering group by generating the third data (i.e., the third data of value "0") corresponding to the upper threshold voltage distribution (i.e., the threshold voltage distribution D2B of FIG. 3A). Using the first voltage or a higher voltage as the threshold voltages of the adjustment memory cells may induce the BPD in the target memory cells. At step S103, the storage of the third data corresponding to the upper threshold voltage distribution into the adjustment memory cells may allow the adjustment memory cells to form the upper threshold voltage distribution (e.g., the threshold voltage distribution D2B of FIG. 3A).

Figure 12:
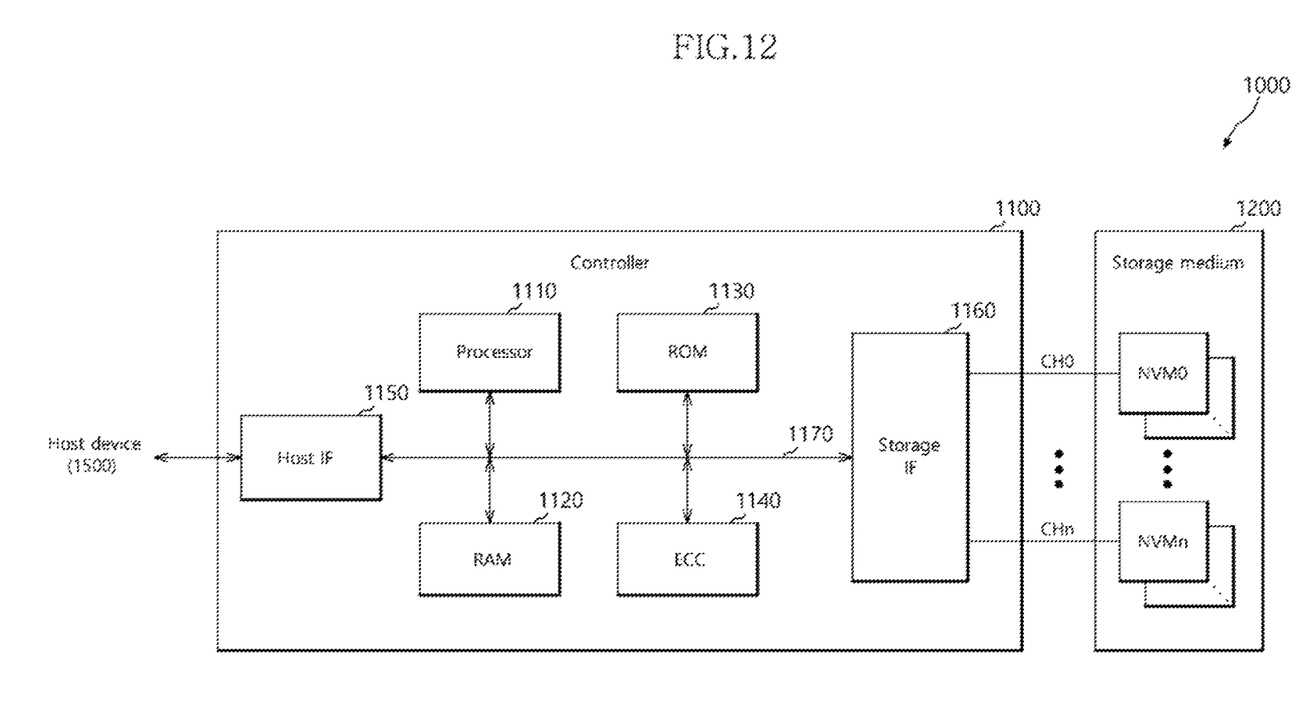
FIG. 12 is a block diagram illustrating a solid state drive (SSD), according to an embodiment of the invention.

FIG. 12 is a block diagram illustrating a solid state drive (SSD) 1000, according to an embodiment of the invention.

The SSD 1000 may include a controller 1100 and a storage medium 1200.

The controller 1100 may control data exchange between a host device 1500 and the storage medium 1200. The controller 1100 may include a processor 1110, a RAM 1120, a ROM 1130, an ECC unit 1140, a host interface 1150, and a storage medium interface 1160.

The controller 1100 may operate in a manner substantially similar to the controller 100 shown in FIG. 1. The controller 1100 may adjust threshold voltages of adjustment memory cells which share bit lines with the target memory cells, according to threshold voltages of the target memory cells and adjacent memory cells adjacent to the target memory cells.

The processor 1110 may control the general operations of the controller 1100. The processor 1110 may store data in the storage medium 1200 and read stored data from the storage medium 1200, according to data processing requests from the host device 1500. In order to efficiently manage the storage medium 1200, the processor 1110 may control the internal operations of the SSD 1000, such as a merge operation a wear leveling operation and so forth.

The RAM 1120 may store programs and program data to be used by the processor 1110. The RAM 1120 may temporarily store data transmitted from the host interface 1150 before transferring them to the storage medium 1200. The RAM 1120 may temporarily store data transmitted from the storage medium 1200 before transferring them to the host device 1500.

The ROM 1130 may store program codes to be read by the processor 1110. The program codes may include commands to be processed by the processor 1110 for the processor 1110 to control the internal units of the controller 1100.

The ECC unit 1140 may encode data to be stored in the storage medium 1200 and may decode data read from the storage medium 1200. The ECC unit 1140 may detect and correct an error occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CH0 to CHn.

The storage medium 1200 may include the plurality of nonvolatile memory devices NVM0 to NVMn. Each of the plurality of nonvolatile memory devices NVM0 to NVMn may perform a write operation and a read operation according to the control of the controller 1100.

Figure 13:
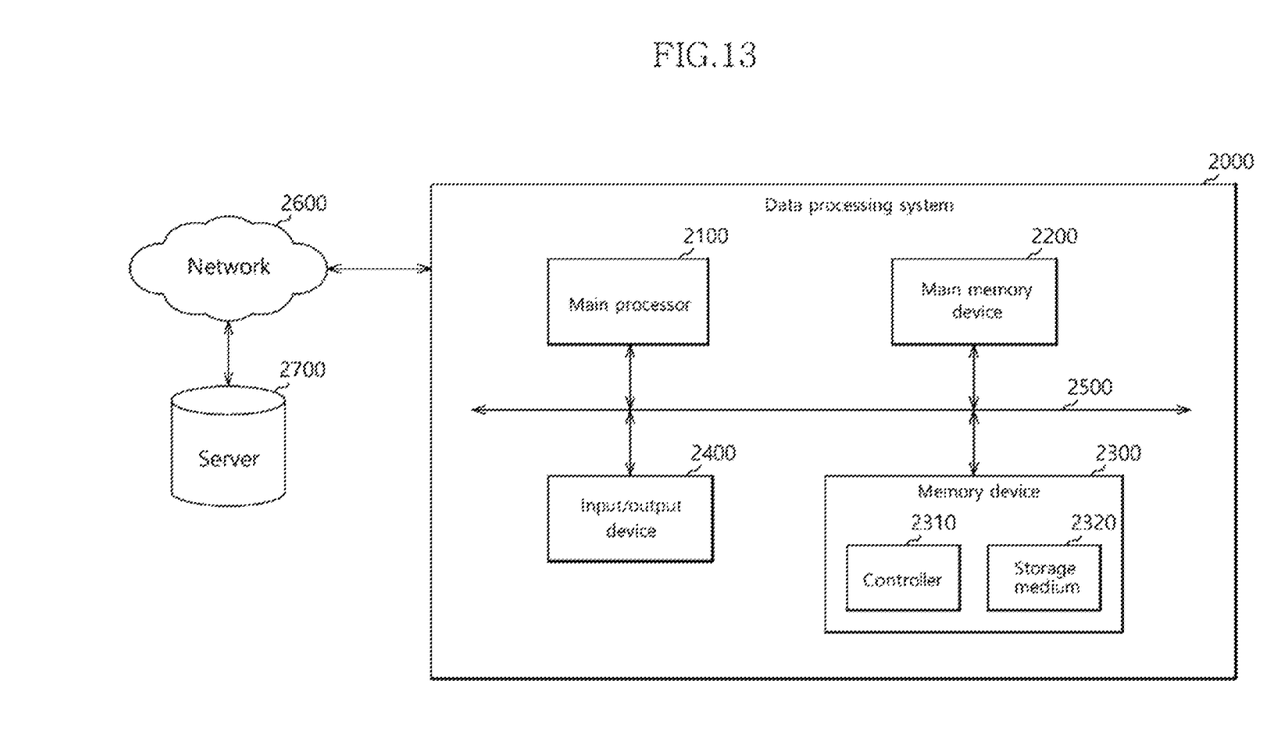
FIG. 13 is a block diagram illustrating a data processing system including a data storage device, according to according to an embodiment of the invention.

FIG. 13 is a block diagram illustrating a data processing system 2000 including a data storage device 10, according to an embodiment of the invention.

The data processing system 2000 may include a computer, a laptop, a netbook, a smart phone, a digital TV, a digital camera, a navigator, etc. The data processing system 2000 may include a main processor 2100, a main memory device 2200, a data storage device 2300, and an input/output device 2400. The internal units of the data processing system 2000 may exchange data control signals etc. through a system bus 2500.

The main processor 2100 may control general operations of the data processing system 2000. The main processor 2100 may be, for example, a central processing unit such as a microprocessor. The main processor 2100 may execute the software of an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate in a manner substantially similar to the data storage device 10 shown in FIG. 1.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a LAN (local area network), a WAN (wide area network), a wireless network, and so on. The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments. Many other embodiments and or variations thereof may be envisaged by those skilled in the relevant art without departing from the spirit and or scope of the present invention as defined in the appended claims.

What is claimed is:

1. A data storage device comprising:
   a nonvolatile memory device including a target memory cell and one or more adjustment memory cells sharing a bit line with the target memory cell, wherein one or more of the one or more adjustment memory cells are memory cells adjacent to the target memory cells, the nonvolatile memory device being suitable for reading out data from or storing data in the target memory cell, and the adjustment memory cells; and a controller suitable for adjusting threshold voltages of the one or more adjustment memory cells based on threshold voltages of the target memory cell and the one or more adjacent memory cells.

2. The data storage device according to claim 1, wherein the controller increases threshold voltages of the adjustment memory cells when the threshold voltage of the target memory cell is lower than a read voltage and the threshold voltage of the one or more adjacent memory cells is lower than a reference voltage.

3. The data storage device according to claim 1, wherein the controller increases the threshold voltages of the adjustment memory cells when the threshold voltage of the target memory cell is higher than a read voltage.

4. The data storage device according to claim 1 wherein the controller decreases the threshold voltages of the one or more adjustment memory cells when the threshold voltage of the target memory cell is lower than a read voltage and the threshold voltage of the one or more adjacent memory cells is higher than a reference voltage.

5. The data storage device according to claim 1, wherein the controller adjusts the threshold voltages of the one or more adjustment memory cells when an error correction operation to data read from the target memory cell fails.

6. A data storage device comprising:
a nonvolatile memory device including a first memory cell and one or more third memory cells sharing bit lines with the first memory cell, one or more second memory cells which are one or more memory cells of the one or more third memory cells which are adjacent to the first memory cell, the nonvolatile memory device being suitable for reading out data therefrom or storing data therein; and a controller suitable for storing third data into the third memory cells based on first data read from the first memory cell and second data read from the second memory cells.

7. The data storage device according to claim 6, wherein the controller stores the third data so that threshold voltages of the third memory cells are higher than a first voltage when the first data represent that the first memory cell has a threshold voltage lower than a read voltage and the second data represents that the second memory cells have threshold voltages lower than a reference voltage.

8. The data storage device according to claim 7, wherein the controller stores the third data thereby inducing a Back Pattern Dependency (BPD) in the first memory cell.

9. The data storage device according to claim 6, wherein the controller stores the third data so that threshold voltages of the third memory cells is higher than a first voltage when the first data represent that the first memory cell has a threshold voltage higher than a read voltage.

10. The data storage device according to claim 9, wherein the controller stores the third data in order to induce a Back Pattern Dependency (BPD) in the first memory cell.

11. The data storage device according to claim 5, wherein the controller stores the third data so that threshold voltages of the third memory cells are lower than a second voltage when the first data represents that the first memory cell has a threshold voltage lower than a read voltage and the second data represents that the second memory cells have threshold voltages higher than a reference voltage.

12. The data storage device according to claim 11, wherein the controller stores the third data in order to suppress a Back Pattern Dependency (BPD) in the first memory cell.

13. The data storage device according to claim 6, wherein the controller stores the third data when an error correction operation to the first data fails.

14. A method for operating a data storage device including a first memory cell and one or more third memory cells sharing bit lines with the first memory cell, one or more of the third memory cell being second memory cells adjacent to the first memory cell, the method comprising:
acquiring first data read from the first memory cell;
acquiring second data read from the second memory cells; and
storing a third data into the third memory cells based on the first and second data.

15. The method according to claim 14, wherein the storing of the third data is performed so that threshold voltages of the third memory cells are higher than a first voltage when the first data represent that the first memory cell has a threshold voltage lower than a read voltage and the second data represents that the second memory cells have threshold voltages lower than a reference voltage.

16. The method according to claim 15, wherein the storing of the third data is performed thereby inducing a Back Pattern Dependency (BPD) in the first memory cell.

17. The method according to claim 14, wherein the storing of the third data is performed so that threshold voltages of the third memory cells is higher than a first voltage when the first data represent that the first memory cell has a threshold voltage higher than a read voltage.

18. The method according to claim 17, wherein the storing of the third data is performed thereby inducing a Back Pattern Dependency (BPD) in the first memory cell.

19. The method according to claim 14, wherein the storing of the third data is performed so that threshold voltages of the third memory cells are lower than a second voltage when the first data represents that the first memory cell has a threshold voltage lower than a read voltage and the second data represents that the second memory cells have threshold voltages higher than a reference voltage.

20. The method according to claim 19, wherein the storing of the third data is performed thereby suppressing a Back Pattern Dependency (BPD) in the first memory cell.

21. The method according to claim 14, wherein the acquiring of the first and second data and the storing of the third data are performed when an error correction operation to the first data fails.

* * * * *